(12) United States Patent
Ma et al.

(10) Patent No.: US 7,828,565 B2
(45) Date of Patent: Nov. 9, 2010

(54) ELECTRICAL CONNECTOR ASSEMBLY WITH PICK UP CAP

(75) Inventors: Hao-Yun Ma, Tu-cheng (TW); Cheng-Chi Yeh, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/383,500

(22) Filed: Mar. 25, 2009

(65) Prior Publication Data
US 2009/0246989 A1  Oct. 1, 2009

(30) Foreign Application Priority Data
Mar. 25, 2008  (CN)  .................... 2008 2 0033113 U

(51) Int. Cl.
 *H01R 13/44*  (2006.01)
(52) U.S. Cl. ....................................... 439/135; 439/940
(58) Field of Classification Search ................. 439/135, 439/342, 940
See application file for complete search history.

(56) References Cited

U.S. PATENT DOCUMENTS 6,626,691 B2 * 9/2003 Yu .............................. 439/342
6,905,353 B2 * 6/2005 Ma et al. ..................... 439/135

* cited by examiner

*Primary Examiner*—Briggitte R Hammond
(74) *Attorney, Agent, or Firm*—Andrew C. Cheng; Wei Te Chung; Ming Chieh Chang

(57) ABSTRACT

An electrical connector assembly includes a socket body defining a receiving cavity, a pick up cap attached detachably onto the socket body and a movable fixing mechanism surrounding the socket body. The fixing mechanism includes a rotatable cover defining an open position and a close position and having two pressing portions extending towards the receiving cavity of the socket body. The pick up cap covers all terminals in the socket body and includes a planar body having concaved portions for receiving the corresponding pressing portions to prevent the pressing portions from interfering with top surface of the planar body of the pick up cap.

11 Claims, 5 Drawing Sheets

ELECTRICAL CONNECTOR ASSEMBLY WITH PICK UP CAP

BACKGROUND OF THE INVENTION

1. Field of the Invention

The present invention relates to an electrical connector assembly for electrically connecting an electronic package, such as an integrated circuit (IC), package with a circuit substrate, such as a printed circuit board (PCB), and particularly to an electrical connector assembly with a pick up cap, which has concaved portions for bearing external pressing forces.

2. Description of the Related Art

Land grid array (LGA) connector assembly for electrically connecting a land grid package (LGP) with a printed circuit board (PCB) is widely used. In an automatic assembly process, the LGA connector assembly can be accurately and rapidly assembled to a predetermined position on a PCB by means of a vacuum-suction device.

FIG. 1 illustrates a conventional LGA connector assembly 100' that is capable of being moved by a vacuum-suction device (not shown), and the LGA connector assembly 100' includes a socket body, a pick up cap 2' mounted on the socket body, and a fixing mechanism disposed around the socket body. The fixing mechanism includes a stiffener 12', a top cover 14' connected pivotally to a first end of the stiffener 12' and having a central opening 141', and an L-shaped load lever 15' mounted pivotally on a second end of the stiffener 12' opposite to the first end. The top cover 14' has an engaging tongue 142' that is operable so as to be pressed by a bent central section 151' of the load lever 15' and two opposite pressing portions 143' offset downwardly. The socket body includes an insulative housing 11' and a plurality of terminals 13' received in the insulative housing 11'. The insulating housing 11' is mounted in the stiffener 12' and has a receiving cavity 111' for accommodating an LGP (not shown). The pick up cap 2' is disposed within the receiving cavity 111' of the insulating housing 11', and can be sucked by a vacuum-suction nozzle of the vacuum suction device (not shown). The pick up cap 2' has a planar body 20', and a plurality of positioning protrusions 21' extending outwardly from a periphery of the planar body 20' and engaged respectively in corresponding positioning grooves 114' in the insulating housing 11', such that the pick up cap 2' is positioned relative to the insulating housing 11'. When the top cover 14' is operated to a close position, the two pressing portions 143' of the top cover 14' abuts against the pick up cap 2'.

Further, two gaps 24' may be provided in the planar body 20' of the pick up cap 2' between two positioning protrusions 21' and extending along peripheral edges of the pick up cap 2'. The gaps 24' avoid interference between the pressing portions 143' of the top cover 14' and the pick up cap 2', and can also serve as ventilation openings and may improve the air flow into the insulative housing 11' when the pick up cap 2' is coupled to insulative housing 11'.

However, in the above-mentioned LGA connector assembly 100', due to the two gaps 24', the receiving cavity 111' of the insulative housing 11' can't be covered completely when the top cover 14' is in the close position. In this case, some of the terminals 13' received in the insulative housing 11' are exposed to external surroundings. As a result, the terminals 13' may be contaminated by external elements, such as dust, solder, and the like.

In view of the above, a new pick up cap for use with an LGA connector assembly which overcomes the above-mentioned disadvantages is desired.

SUMMARY OF THE INVENTION

Accordingly, an object of the present invention is to provide an LGA connector assembly with a pick up cap having concaved portions for bearing external force.

To achieve the above-mentioned object, an LGA connector assembly in accordance with the present invention, for interconnecting an electronic package and a circuit substrate, comprises an insulative housing, a plurality of terminals disposed in the insulative housing, a pick up cap mounted detachably upon the insulative housing and covering the terminals, and a moveable fixing mechanism for holding the electronic package in the receiving cavity of the insulative housing. The insulative housing has a receiving cavity in a top surface thereof for receiving an electronic package, and said insulative housing has a pair of opposite sidewalls along a longitudinal direction. Each terminal has a contacting portion extending upwardly into the receiving cavity. The pick up cap has an upper surface and two opposite lateral portions along the longitudinal direction, and each lateral portion defines a concaved portion recessed downwardly from the upper surface. The fixing mechanism includes a rotatable cover defining an open position and a close position, and the cover has an opening and two pressing portion extending towards the receiving cavity of the insulative housing. When the cover is rotated from the open position to the close position, the pressing portions partially insert into the respective concaved portions of the pick up cap and resist against a bottom surface of the concaved portions.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
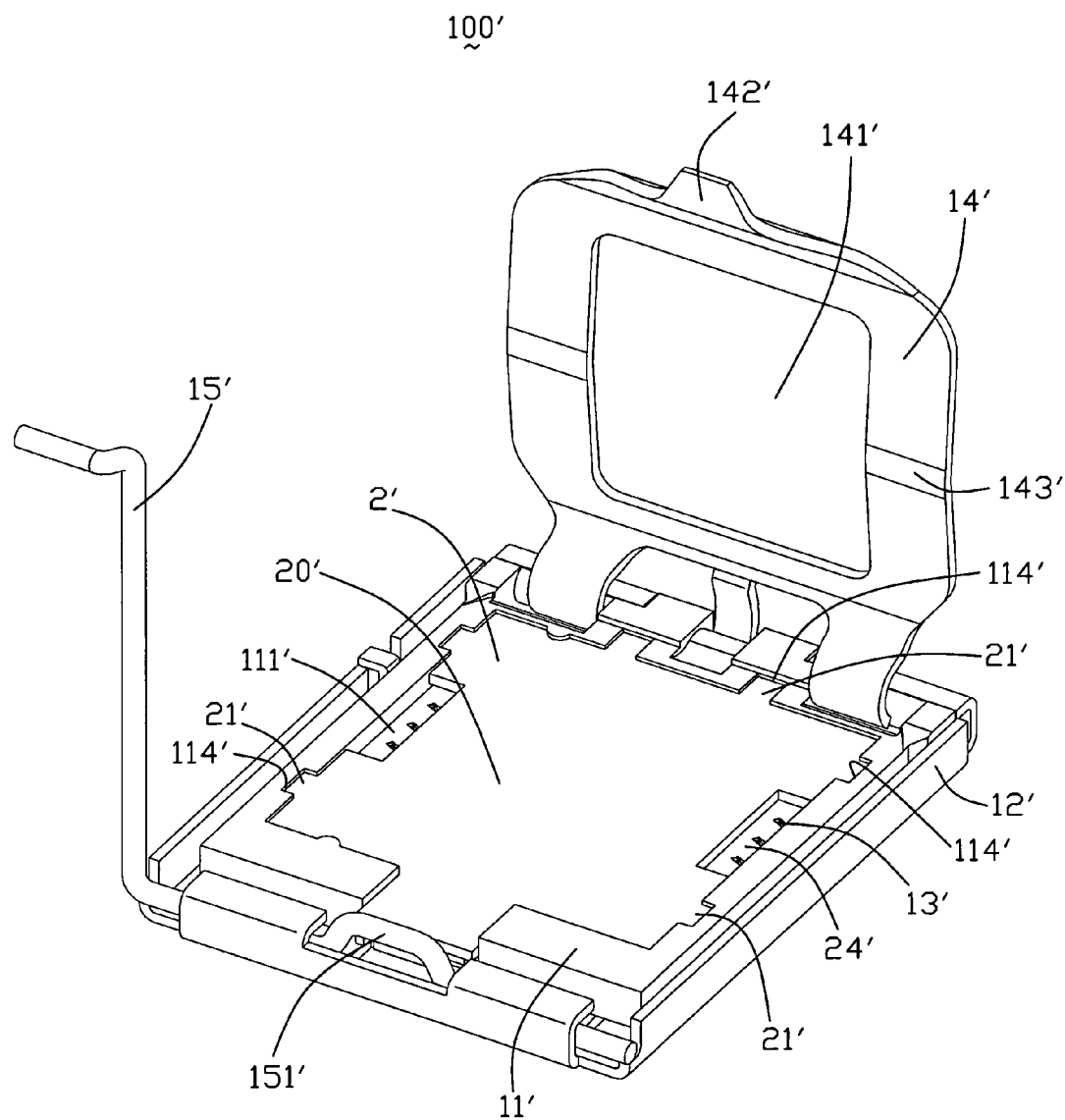
FIG. 1 is a perspective view of a conventional LGA connector assembly.
Figure 2:
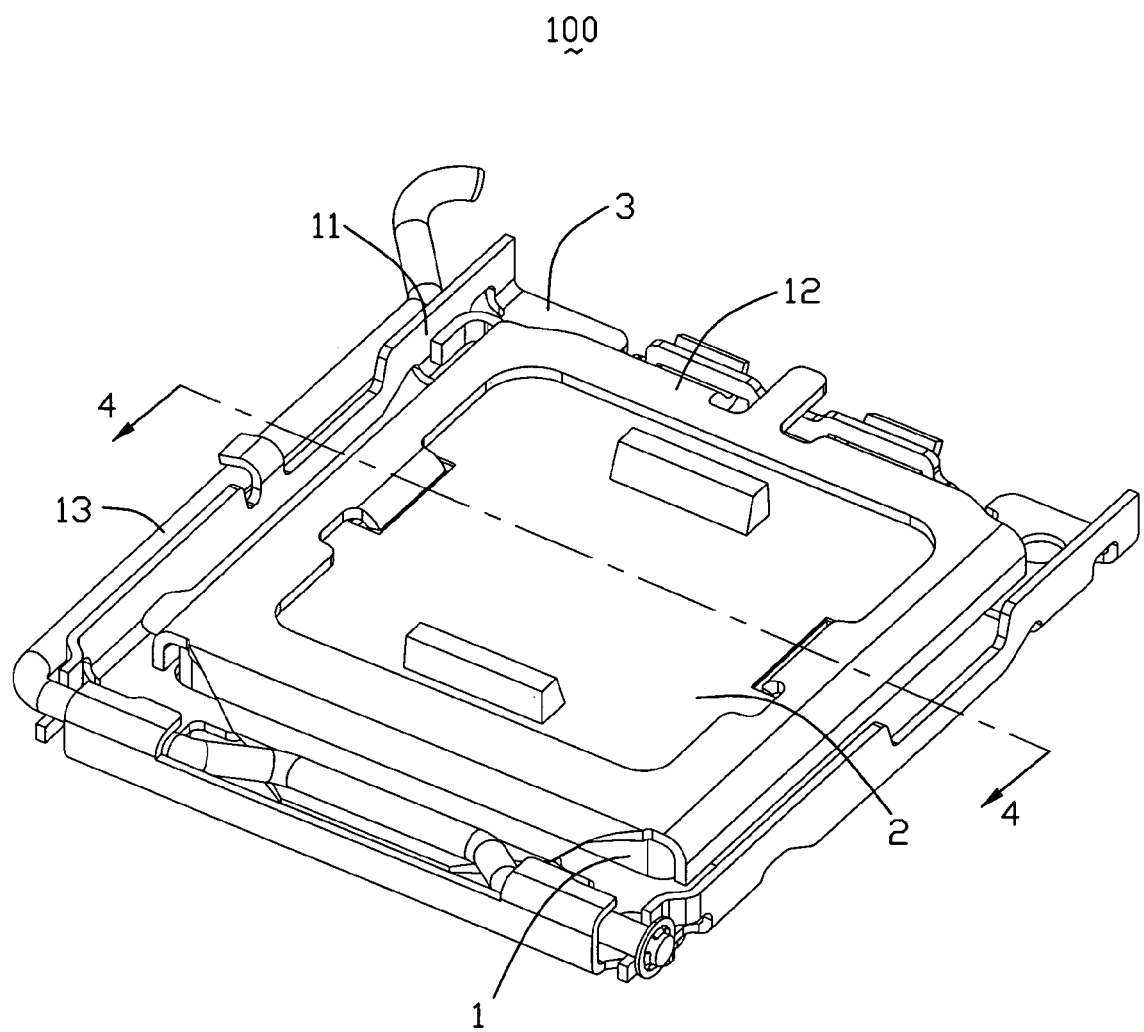
FIG. 2 is an assembled, perspective view of an LGA connector assembly in accordance with the preferred embodiment of the present invention.
Figure 3:
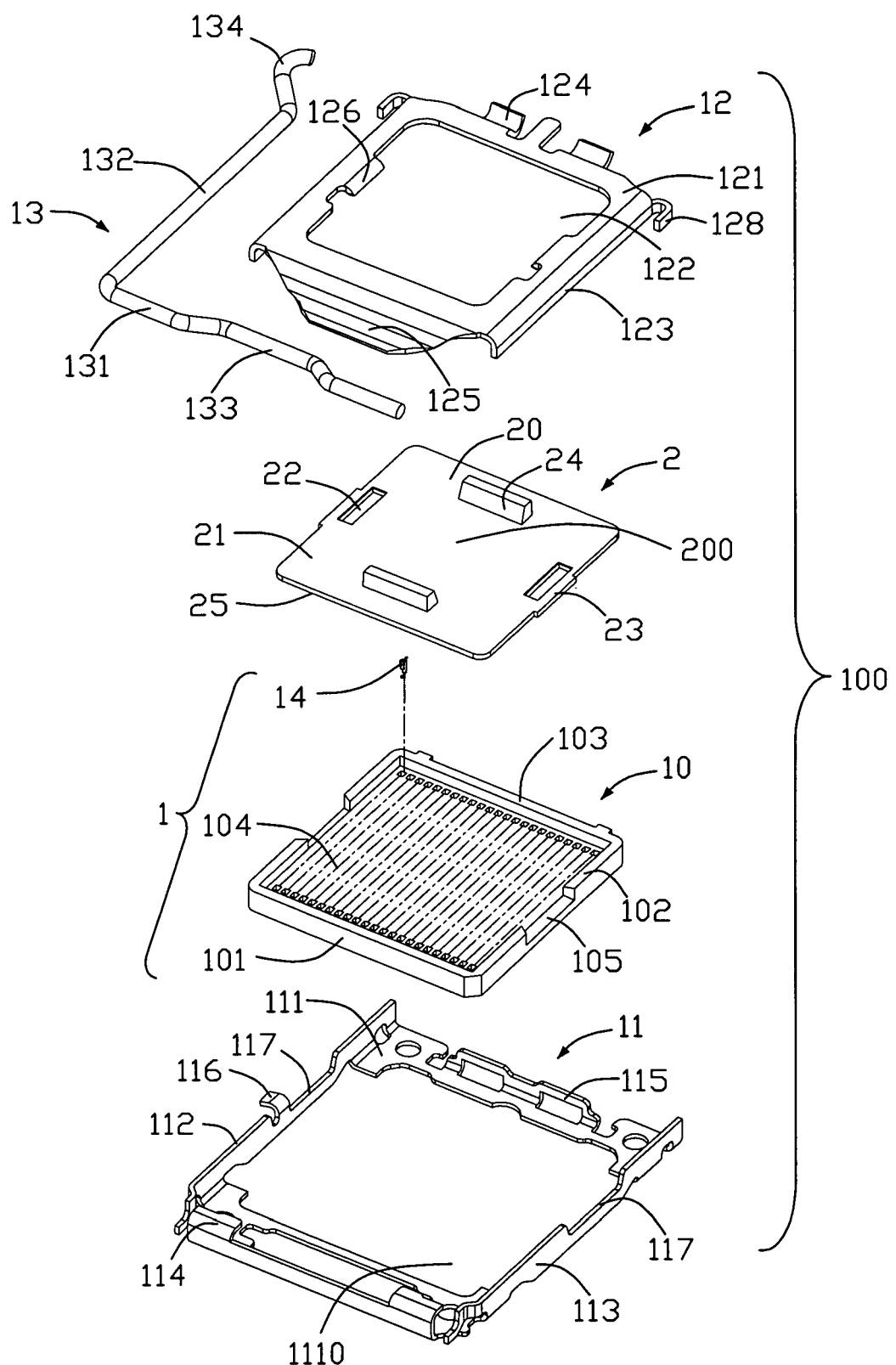
FIG. 3 is an exploded, perspective view of the LGA connector assembly shown in FIG. 2.
Figure 4:
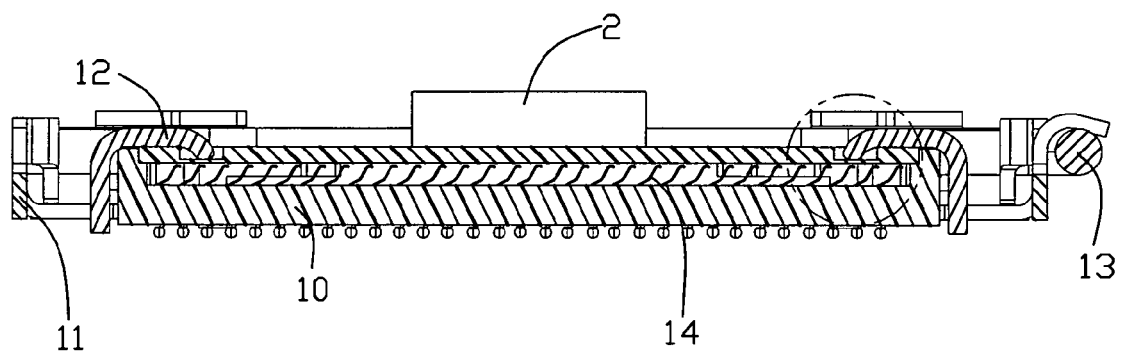
FIG. 4 is cross-section view of the LGA connector assembly taken along line 4-4 of the FIG. 2.

Referring to FIGS. 2 to 4, the preferred embodiment of an LGA connector assembly 100 according to the present invention is shown, which includes an socket body 1, a pick up cap 2 detachably attached on the socket body 1 and a moveable fixing mechanism 3 disposed around the socket body 1. The LGA connector assembly 100 is capable of being moved by a vacuum-suction device (not shown) to a predetermined position on a printed circuit board (PCB) (not shown) during an automatic assembly process.

The socket body 1 includes an insulative housing 10 and a plurality of terminals 14 received in the insulative housing 10. The insulative housing 10 has a generally square configuration and includes a base 101 and two pairs of opposite peripheral sidewalls 102, 103 extending upwardly from the base 101. The base 101 and the sidewalls 102, 103 commonly define a receiving cavity 104 for accommodating an LGP (not shown). The base 101 defines a plurality of passageways (not labeled) therethrough adapted for receiving the plurality of terminals 14 therein. The pair of longitudinal sidewalls 102 each defines a first cutout 105 in a centre thereof for removing the LGP (not shown) friendly. The cutout 105 laterally runs through the longitudinal sidewall 102. Each terminal 14 has a contacting section 141 extending upwardly into the receiving cavity 104 for contacting the LGP (not shown).

The pick up cap 2 is mounted detachably upon the insulative housing 10 of the socket body 1 and covers the whole receiving cavity 104 of the insulative housing 10, thus all the terminals 14 received in the insulative housing 10 are shielded below the pick up cap 2. The pick up cap 2 includes a planar body 20 having a smooth upper surface 200 and two opposite lateral portions 21 along the longitudinal direction. Each lateral portion 21 defines a concaved portion 22 in a centre thereof recessed downwardly from the upper surface 200, and the concaved portion 22 has a generally rectangular cross section. Furthermore, two protrusions 23 extend outwardly form outside edges of the lateral portions 21 and are adjacent to corresponding concaved portions 22. When the pick up cap is mounted on the socket body 1, the protrusions 23 of the pick up cap 2 are received into the corresponding cutouts 105 of the insulative housing 10 fitly, thus the pick up cap 2 is positioned in the receiving cavity 104 of the insulative housing 10. The pick up cap 2 also has two opposite handling portions 24 projecting upwardly form the upper surface 200 thereof, adapted for taking the pick up cap 2 out from the insulative housing 10.

The fixing mechanism 3 includes three elements: a stiffener 11 mounted surrounding the socket body 1, a cover 12 and a lever 13 pivotally engaged with respective ends of the stiffener 11. The stiffener 11 includes a bottom plate 111 having a window 1110 for receiving the insulative housing 10, two opposite substantially vertical walls 112, 113 extending upwardly from the bottom plate 111, a front end 114 and an opposite rear end 115 substantially perpendicular to the two walls 112, 113. A hooking portion 116 extends outwardly from a top edge of the wall 112 for retaining the lever 13. The two walls 112, 113 are parallel and adjacent to the longitudinal sidewalls 102 of the insulative housing 10, respectively, and each defines a second cutout 117 corresponding to the first cutout 105 of the longitudinal sidewall 102. The second cutouts 117 run through top edges of the walls 112, 113 respectively.

The cover 12 is pivotally engaged with the rear end 112 of the stiffener 11 and has a substantially rectangular configuration and includes a main body 121 defining an center opening 122, two opposite blocking walls 123 bent downwardly from two lateral edges of the main body 121, respectively, a pair of latches 124 extending from one end of the main body 121 for engaging with the rear end 112 of the stiffener 11, and a tongue portion 125 extending from the other end of the main body 121 for being pressed by the lever 13. A pair of curved pressing portions 126 bends toward the socket body 1 extending from two opposite inner edges of the opening 122 for pressing the LGP (not shown) which is seated in the receiving cavity 104 of the insulative housing 10. The cover 12 further has a self-aligning portion 128 with a J-like cross-section extending from a rear edge of each blocking wall 123, which engages with the stiffener 11 so that the cover 12 is not deflected.

The lever 13 is pivotally engaged with the front end 114 of the stiffener 11 and includes a pivotal arm 131 and an operational arm 132 substantially perpendicular to the pivotal arm 131. The pivotal arm 131 has a middle offset tab 133 for pressing on the tongue portion 125 of the cover 12, and the operational arm 132 has a curved handle 134 extending outwardly thereof.

Figure 5:
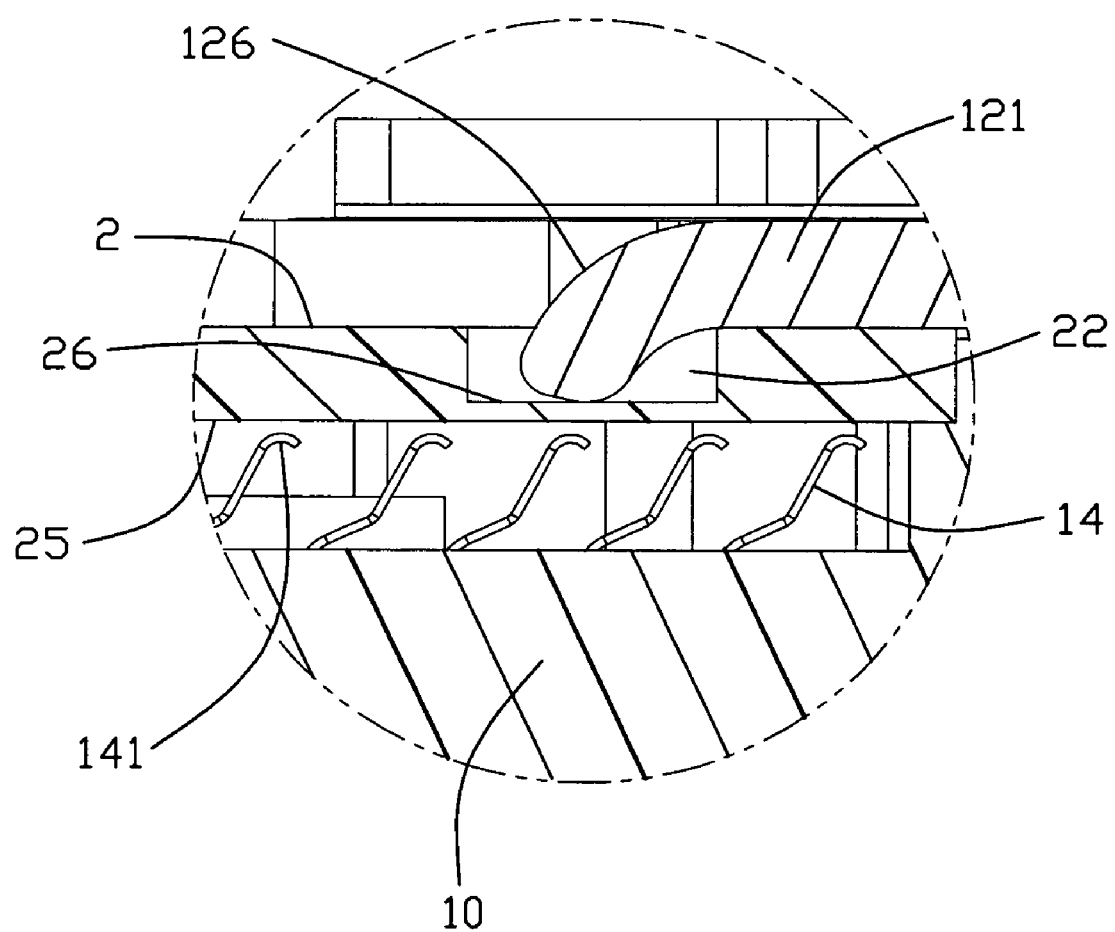
FIG. 5 is an enlarged view of encircled portion shown in FIG. 2.

Turning now to FIGS. 2, 4 and 5, when the LGA connector assembly 100 is assembled, the cover 12 can be rotated between an open position and the horizontal close position. In use, the cover 12 is rotated to the horizontal close position, and is fastened to the socket body 1 by the lever 13. At this moment, the upper surface 200 of the planar body 20 of the pick up cap 2 faces the center opening 122 of the cover 12, and the pressing portions 126 of the cover 12 partially insert into the respective concaved portions 22 of the pick up cap 2 and resist against a bottom surface 26 of the concaved portions 22, and a lower surface 25 of the pick up cap 20 opposite to the upper surface 200 is distant to the contacting sections 141 of the terminals 14 so as not to contact with the contacting sections 141. The vacuum-suction device (not shown) can pass through the center opening 122 and engage on the upper surface 200 of the pick up cap 2 for moving of the LGA connector assembly 100 to a predetermined location.

In such a configuration, the pick up cap 2 covers the whole receiving cavity 104 of the insulative housing 10 and all the terminals 14 to prevent the terminals 14 from being contaminated by external element such as dust, solder and the like. When the cover 12 is rotated to the horizontal close position, the pressing portions 126 of the cover 12 are received in the respective concaved portions 22 of the pick up cap 2 without interfering with the upper surface 200 of the pick up cap 20. It is noted that, in the preferred embodiment, the handling portions 24 are sealed, however, ventilation openings may be disposed on out edges of the handling portions 24 to improve air flow into the receiving cavity 104 of the insulative housing 10.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector, for interconnecting an electronic package and a circuit substrate, comprising:
   an insulative housing having a receiving cavity in an top surface thereof for receiving the electronic package;
   a plurality of terminals disposed in the insulative housing with contacting sections extending upwardly into the receiving cavity; and
   a pick up cap mounted detachably upon the insulative housing, said pick up cap having an upper surface and two opposite lateral portions along the longitudinal direction, and each lateral portion defining a concaved portion recessed downwardly from the upper surface adapt for bearing an external pressing force; wherein the pick up cap includes two opposite handling portions extending upwardly form the top surface thereof adapted for taking the pick up cap out from the insulative housing.

2. The electrical connector as claimed in claim 1, wherein the insulative housing has a pair of opposite sidewalls along a longitudinal direction, each sidewall of the insulative housing has a cutout in a centre thereof, and the pick up cap has two protrusions extending outwardly form the lateral portions, when the pick up cap is mounted on the insulative housing, the protrusions of the pick up cap are received in the corresponding cutouts of the insulative housing fitly.

3. The electrical connector as claimed in claim 1, wherein the pick up cap includes a lower surface opposite to the top surface thereof, when the pick up cap is attached on the insulative housing, the lower surface of the pick up cap is distant to the contacting sections of the terminals.

4. An electrical connector assembly comprising:
an insulative housing having a receiving cavity in an top surface thereof for receiving an electronic package;
a plurality of terminals disposed in the insulative housing with contacting sections extending upwardly into the receiving cavity;
a pick up cap mounted detachably upon the insulative housing and covering the terminals, said pick up cap having an upper surface and two opposite lateral portions along the longitudinal direction, and each lateral portion defining a concaved portion recessed downwardly from the upper surface; and
a moveable fixing mechanism for holding the electronic package in the receiving cavity of the insulative housing, said fixing mechanism including a rotatable cover defining an open position and a close position relative to the insulative housing, and the cover having an opening and two pressing portion extending towards the receiving cavity of the insulative housing, the pressing portions partially inserting into the corresponding concaved portions of the pick up cap and resist against a bottom surface of the concaved portions.

5. The electrical connector assembly as claimed in claim 4, wherein the fixing mechanism further includes a stiffener and a lever, said stiffener is mounted around the insulative housing and has a front end and an opposite rear end along the longitudinal direction, the cover is pivotally engaged to the front end and the lever is pivotally engaged to the rear end.

6. The electrical connector assembly as claimed in claim 4, wherein the cover includes a pair of blocking walls extending downwardly corresponding to the sidewalls of the insulative housing, a self-aligning portion is formed on each blocking wall and engages with the stiffener 11 so that the cover is not deflected.

7. An electrical connector assembly comprising:
an insulative housing defining a receiving cavity;
a plurality of contacts disposed in the housing with contacting sections extending upwardly into the receiving cavity;
a metallic retention structure located beside the housing, and including a cover which is pivotally mounted by one end of said housing and defines a central opening therein; and
an insulative cap sandwiched between the cover and the housing so as to be restrained from vertically moving; wherein
said cap is further restrained from horizontally moving by means of not only the housing but also the cover; wherein
said cap defines a concaved portion to receive a protrusion of the cover for restraint of horizontal movement.

8. The electrical connector assembly as claimed in claim 7, wherein said protrusion extends downwardly from an inner edge of the cover and confronts said central opening.

9. The electrical connector assembly as claimed in claim 7, wherein said cap defines a protrusion to be received in a notch of the housing for restraint of horizontal movement.

10. The electrical connector assembly as claimed in claim 9, wherein said protrusion extends in a horizontal direction.

11. The electrical connector assembly as claimed in claim 9, wherein said cap defines a bottom surface under the corresponding concaved portion for not exposing the contacts thereunder.

\* \* \* \* \*